(12) United States Patent
Trezza

(10) Patent No.: US 6,316,286 B1
(45) Date of Patent: Nov. 13, 2001

(54) METHOD OF EQUALIZING DEVICE HEIGHTS ON A CHIP

(75) Inventor: John A. Trezza, Nashua, NH (US)

(73) Assignee: TeraConnect, Inc., Nashua, NH (US)

( * ) Notice: Subject to any disclaimer, the term of this patent is extended or adjusted under 35 U.S.C. 154(b) by 0 days.

(21) Appl. No.: 09/654,425

(22) Filed: Sep. 1, 2000

Related U.S. Application Data

(60) Provisional application No. 60/159,165, filed on Oct. 13, 1999.

(51) Int. Cl.[7] .......................... H01L 21/44; H01L 21/48; H01L 21/50
(52) U.S. Cl. .......................... 438/107; 438/108; 438/109; 438/127; 438/128; 438/129
(58) Field of Search .................................. 438/107, 108, 438/109, 127, 128, 129

(56) References Cited

U.S. PATENT DOCUMENTS

| | | |
|---|---|---|
| 5,099,306 | 3/1992 | Dunaway et al. . |
| 5,454,160 | 10/1995 | Nickel . |
| 5,858,814 * | 1/1999 | Goossen et al. ..................... 438/107 |
| 5,906,312 | 5/1999 | Zakel et al. . |

OTHER PUBLICATIONS

PCT International Search Report dated Jan. 22, 2001 of International Application No. PCT/US00/24135 filed Oct. 13, 2000.

Greig, W.J., Bendat, S., Saba, V.R., Flip Chip Technology : Achieving precise Placement and Attachment.

M. Ajmone Marsan et al, Modelling Slotted Multi–Channel Ring All–Optical Networks, IEEE, 1997, pp. 146–153.

Marco Ajmone Marsan et al, Access Protocols for Photonic WDM Multi–Rings with Tunable Transmitters and Fixed Receivers, SPIE, pp. 59–72, vol. 26921.

Carl Beckmann, Applications: Asynchronous Transfer Mode and Synchronous Optical Network, *Handbook of Fiber Optic Data Communication*, 1998, pp. 385–414, Academic Press.

Floyd E. Ross, An Overview of FDDI: The Fiber Distributed Data Interface, *IEEE Journal on Selected Areas in Communications*, September 1989, pp. 1043–1051, vol. 7 No. 7.

* cited by examiner

*Primary Examiner*—John F. Niebling
*Assistant Examiner*—David A Zarneke
(74) *Attorney, Agent, or Firm*—Scott J. Asmus; Vernon C. Maine

(57) ABSTRACT

A method of equalizing device heights on a chip includes providing on a first chip an array of first devices having a predetermined height including dummy devices with bonding bumps; engaging the bonding bumps on the first chip with those on the second chip; removing the dummy devices to create holes containing the double bumps previously associated with the dummy devices; providing on a third chip an array of second devices having a lower height than the first devices with bonding bumps which match those in the holes; and bump bonding the third chip to the second chip with the second devices in the holes and the bonding bumps on the second devices combining with the multiple bumps in the holes to equalize the height of the first and second devices.

20 Claims, 5 Drawing Sheets

METHOD OF EQUALIZING DEVICE HEIGHTS ON A CHIP

RELATED APPLICATIONS

This application claims priority of provisional patent application Ser. No. 60/159,165 filed Oct. 13, 1999, entitled Bump-On-Bump Structures That Yield Predictable Topology Between Multiple Hybridized Devices.

FIELD OF INVENTION

This invention relates to an improved method of equalizing device heights on a chip and more particularly for planarizing device heights in flip-chip bump bonded chips.

BACKGROUND OF INVENTION

Hybrid CMOS silicon (Si) and gallium arsenide (GaAs) chip technology, also known as flip-chip, has been developed that allows for direct optical input/output from fiber bundles onto logic circuits. The integration of flip-chip technology with electronics is not limited to Silicon CMOS. The integration process would be the same using other substrates, integrated circuits, etc., such as silicon-germanium, gallium arsenide or other semiconductors, including binary, ternary and quaternary compounds. Silicon CMOS is the most advanced today for many applications but the integration of optoelectronic devices with silicon has proved to be problematic for several reasons. Silicon does not have the band-gap structure that supports the generation of light. In addition, there has been limited success in growing epitaxial layers of III–V materials that do support light emission, such as gallium arsenide (GaAs) or indium phosphide (InP), on silicon substrates because of problems including the lattice mismatch. If a III–V device is to be attached to a silicon substrate it must be grown on a separate substrate comprised of an appropriate material and later attached to the silicon. It is desirable to have multiple types of photonic devices, such as emitters and detectors, integrated onto the same silicon substrate. These devices would be co-located on the silicon and possibly interdigitated. Having very different functions, different photonic devices also have very different eptaxial layer construction. It is not economically feasible for two such dissimilar devices to be grown on the same substrate and so it is necessary that separate growth steps be performed to fabricate each device type. It is further desirable that the final height of the photonic devices be controlled during the attachment process. That is, the final relative height between devices must be predetermined and achievable. In many applications, the interdigitized array of photonic devices must be coplanar. Coplanarity is necessary to insure proper optical coupling between the photonic array and the fiber optic bundle or waveguide. One approach to this problem is to artificially fabricate photonic devices that all have the same thickness or physical dimensions. The problem with this solution is that high frequency performance of the detector devices will be compromised since carriers have to transport through extra material. The time/material required for the growth process, molecular beam epitaxy (MBE), or organometallic chemical vapor deposition (OMCVD) of these additional layers can be cost prohibitive.

SUMMARY OF THE INVENTION

It is therefore an object of this invention to provide an improved method of equalizing device heights on a chip.

It is a further object of this invention to provide such a method which planarizes device heights in flip-chip bump bonded chips.

It is a further object of this invention to provide such a method which uses solder bumps to compensate for device height differentials.

It is a further object of this invention to provide such a method which allows each device to be fabricated independently for optimum performance without the need to achieve a fixed height constraint.

It is a further object of this invention to provide such a method which allows different photonic devices to be fabricated on a silicon substrate.

This invention results from the realization that an improved method of equalizing device heights on a chip can be achieved by providing on a first chip an array of first devices having a predetermined height including dummy devices with bonding bumps, bump bonding the first chip to a second chip which has its own bonding bumps, removing the dummy devices to create holes containing the double bumps remaining after removal of the dummy devices, providing on a third chip an array of second devices having a lower height and having bonding bumps which match those in the holes and bump bonding the third chip to the second chip with the second devices in the holes and the bonding bumps on the second devices combining with the double bumps in the holes to equalize the height of the first and second devices.

This invention features a method of equalizing device heights on a chip including providing on a first chip an array of first devices having a predetermined height including dummy devices with bonding bumps. The first chip is bump bonded to a second chip which also has bonding bumps by engaging the bonding bumps on the first chip with those on the second chip. The dummy devices are removed to create holes containing the multiple bumps previously associated with the dummy devices. A third chip is provided with an array of second devices having a lower height than the first devices and having bonding bumps which match those in the holes. The third chip is bump bonded to the second with the second devices in the holes and the bonding bumps on the second devices combining with the multiple bumps in the holes to equalize the height of the first and second devices.

In a preferred embodiment, the voids between the first and second chips may be filled with an underfill. The first chip may be removed except for the first devices. The underfill associated with the dummy devices may be removed and the underfill associated with the remaining devices preserved. The voids between the chips associated with the second devices may also be filled with an underfill. The devices may be photonic devices. The first and third chips may include gallium arsenide, the second chip may include silicon. The second chip may include an application specific integrated circuit. One of the first and second devices may include light emitters and the other light detectors. One of the first and second devices may include vertical cavity surface emitting lasers and the other p-i-n diodes. The dummy devices may be the same as the first devices. The first and third chips may include indium phosphate or indium gallium arsenide nitride. The second chip may include silicon germanium or gallium arsenide. The underfill may include an epoxy or a photoresist. The first chip may be removed except for the first devices and the third chip may be removed except for the second devices.

BRIEF DESCRIPTION OF THE DRAWINGS

Other objects, features and advantages will occur to those skilled in the art from the following description of a preferred embodiment and the accompanying drawings which.

PREFERRED EMBODIMENT

Figure 1:
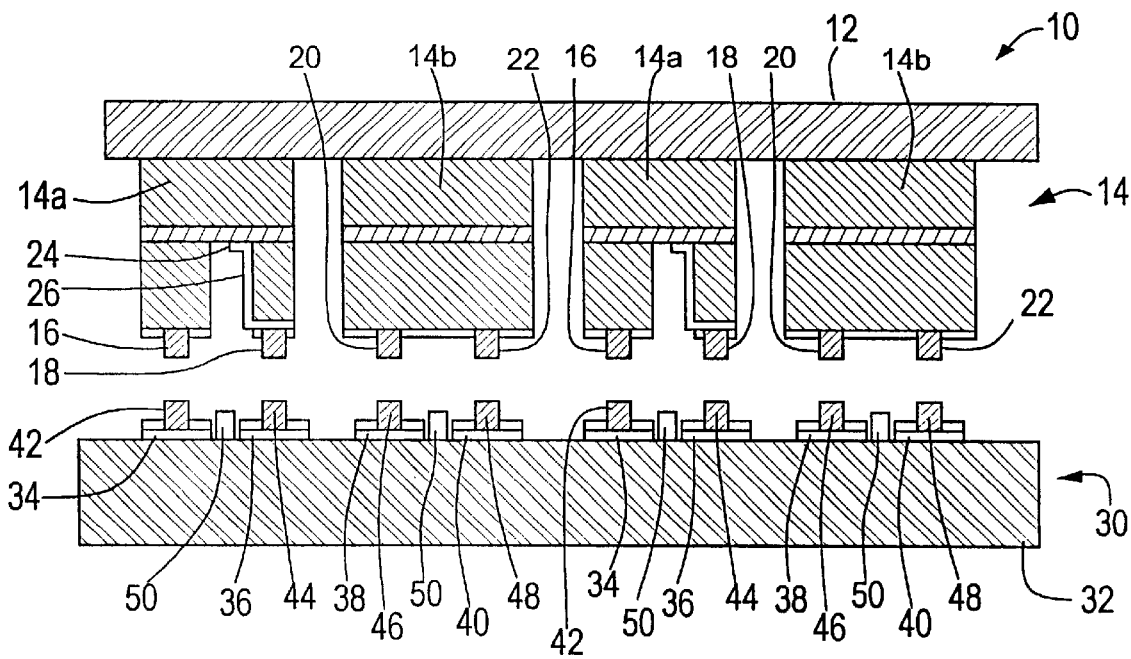
FIG. 1 is schematic side elevational sectional view of a first chip with first devices flip-chipped and about to be bump bonded to a second chip according to this invention.

There is shown in FIG. 1 a first chip 10 including a gallium arsenide (GaAs) substrate on which has been grown a number of devices 14. These devices include a number of real, active devices 14a as well as dummy devices 14b. The real devices may be any type of device usable on an integrated circuit. The dummy devices may be simply more of the real devices which are to be sacrificed or other devices that are convenient to make or simply blanks or anything else which can reserve the space for future use. In this particular embodiment they are preferably photonic devices. More particularly they may be emitters or detectors and in this specific embodiment, the devices are vertical cavity surface emitting lasers (VCSELs). The VCSELs 14a and the dummies 14b which are also VSCELs are all grown together on the gallium arsenide substrate 12. The dummy devices 14b here are identical to the real devices 14a because they have all been grown together. This is for convenience only and the dummy devices could indeed be different devices entirely or simply blanks.

All of the devices include solder balls or bumps. The VCSEL devices include solder bumps 16 and 18 while the dummy VCSELs have solder bumps 20 and 22. The real VCSELs 14a also have an ohmic contact 24 and an electrode 26 which connects with bump 18, but these are not present in the dummy devices 14b, since they are not going to end up as functioning VCSELs, but rather will be disposed of so that the space that they reserve can be used for another device as will be explained subsequently.

A second chip 30 includes a silicon CMOS substrate 32 which contains a number of metal bonding pads 34 and 36 associated with each device 14a and another number of pads 38 and 40 associated with each dummy device 14b. On top of each of the metal bonding pads are solder bumps 42, 44 and 46, 48 respectively. Also carried on silicon CMOS substrate 32 is electronic circuitry for servicing the emitters and detectors which will eventually be a part of the overall assembly. Typically the electronic circuit is an application specific integrated circuit (ASIC) portions of which are shown at 50.

Figure 2:
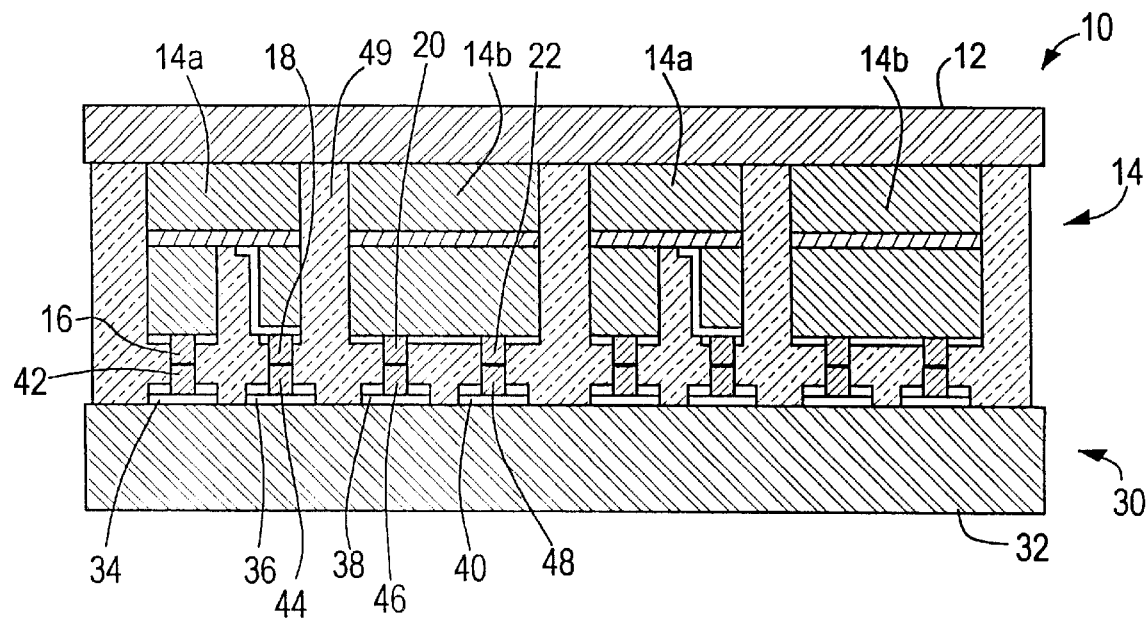
FIG. 2 is a view similar to FIG. 1 after flip-chip bump bonding of the two chips.
Figure 3:
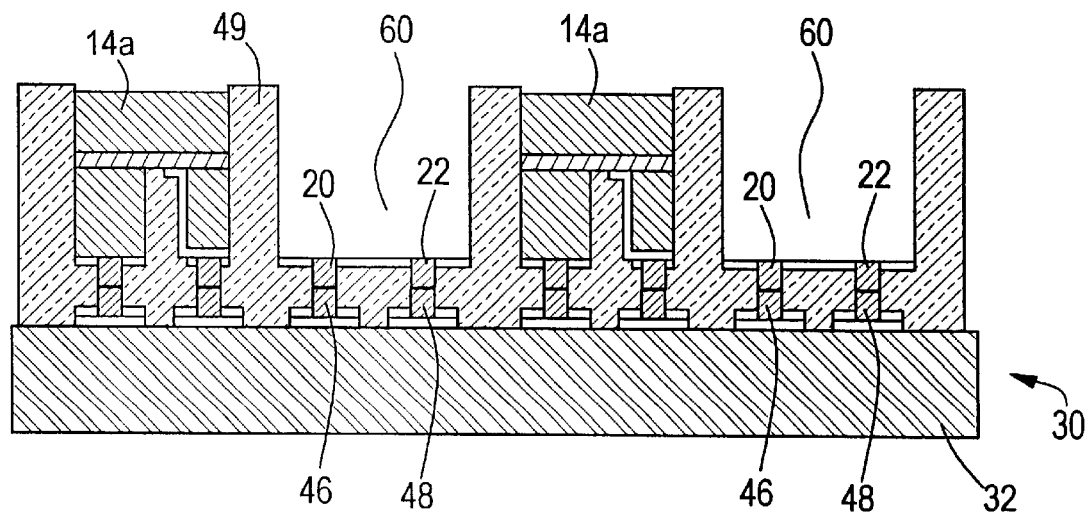
FIG. 3 is a view similar to FIG. 2 after the bulk of the second chip and dummy devices have been removed to create holes in the assembly of FIG. 2.

In FIG. 1 chip 10 has been flipped with respect to chip 30. In FIG. 2, it is flip chip bump bonded to chip 30 so that all of the various bumps 16 and 42, 18 and 44, 20 and 46, 22 and 48 have been engaged and pressed together to make the necessary contact. The solder bumps or balls are typically produced by an evaporation process and the typical sizes AVID run from six microns to forty microns. An underfill 49 such as epoxy or even a photoresist or some other flowable hardener material is introduced between chips 10 and 30 and interstitially of the devices 14a and 14b to provide mechanical stability during the further processing of the assembly and permanently after completion of fabrication. The second chip 10 has the gallium arsenide substrate 12 completely removed except for the emitters by chemical etching and mechanical means after which a mask of photoresist is placed over the assembly. The mask covers the devices 14a which are to be kept and exposes the dummy devices 14b which are to be removed. After suitable etching and removal of the mask, the assembly appears as in FIG. 3 where only the true devices, the VCSELs 14a remain and there are holes 60 where the dummy devices 14b previously were. Still remaining behind associated with each of these holes are the multiple bumps 20–46 and 22–48.

Figure 4:
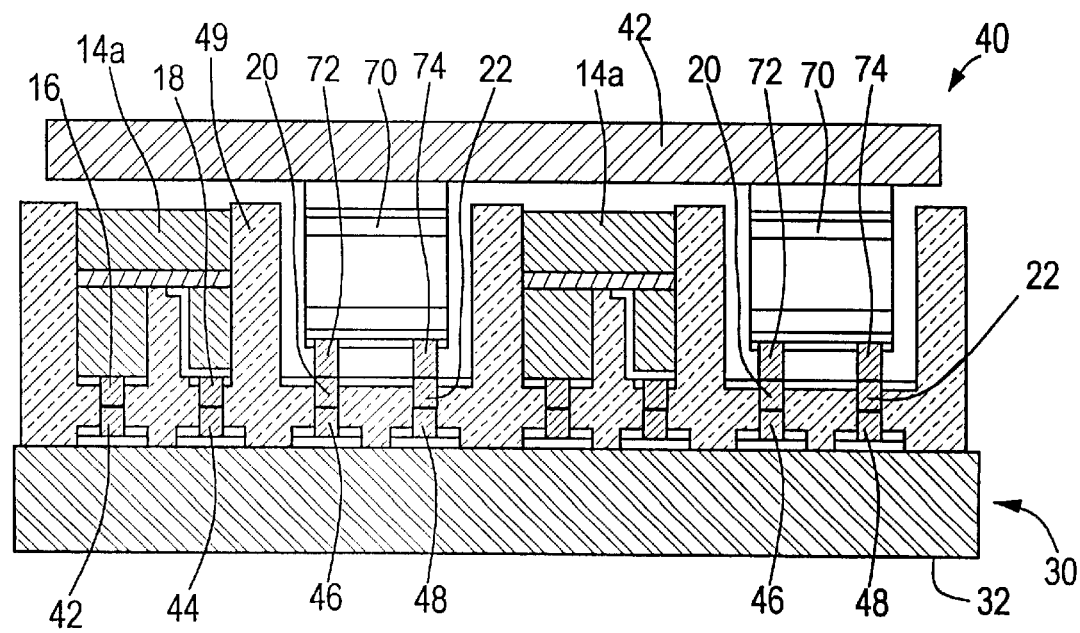
FIG. 4 is a view similar to FIG. 3 with a third chip having second devices about to be flip-chip bump bonded into the holes on the second chip in the assembly of FIG. 3.
Figure 5:
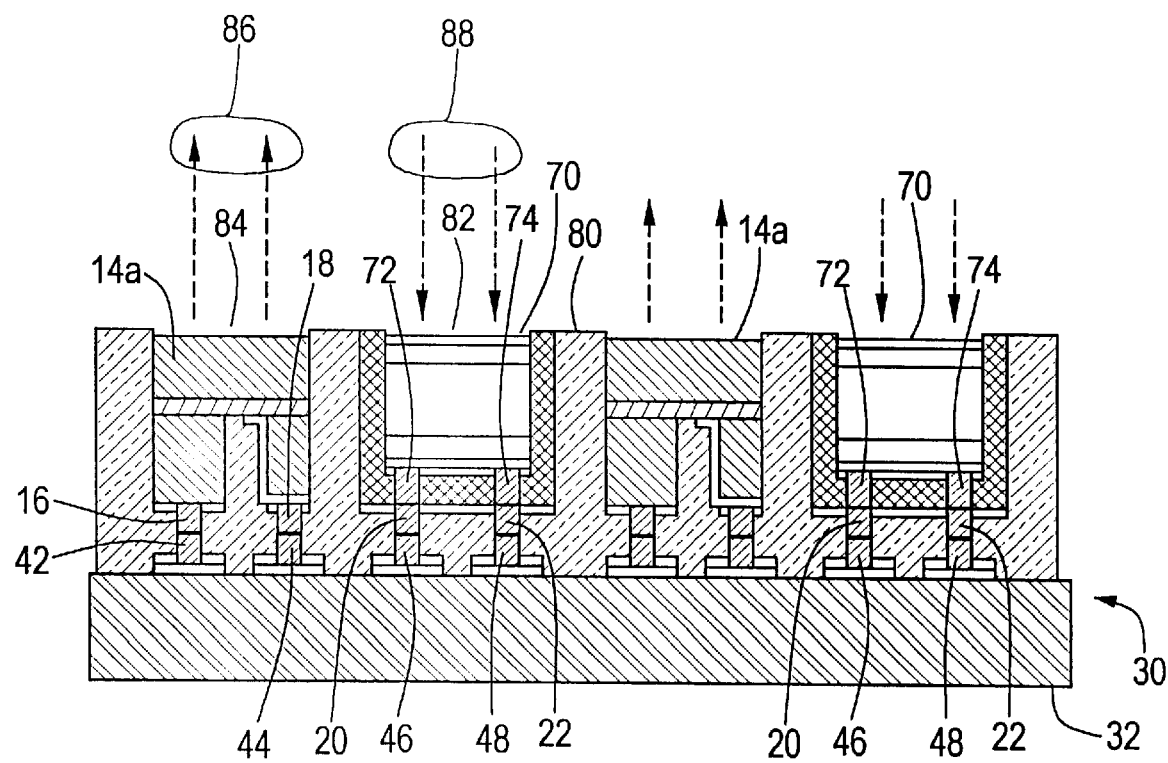
FIG. 5 is a view similar to FIG. 3 with the bulk of the third chip removed.

A third chip 40, FIG. 4 including gallium arsenide substrate 42 is formed with detectors 70 grown on it. These detectors are typically p-i-n diodes which detect the light in the range of 850 mm. These detectors 70 are accompanied with their own solder bumps 74. Chip 40 is now pressed to chip 30 compressing the bumps 72, 20 and 46 and bumps 74, 22 and 48. The extra height afforded by the three bumps here as opposed to the two bumps which interconnect the VCSEL devices 14a with substrate 32 make up for the difference in height between detectors 70 which are shorter and VCSELs 14a which are taller and use only two bumps 16 and 42 and 18 and 44. When this step has been completed an underfill 80 is introduced again to fill the remaining voids as shown in FIG. 5 and the gallium arsenide substrate 42 is removed except for the detector 70. By virtue of the triple bumps in the holes receiving the detectors, the detectors now have their exposed surface 82, at the same height and coplanar with the exposed surface 84 of VCSELs 14a, so that the outgoing light rays 86 from emitters 14a and the incoming light rays 88 to detectors 70 propagate freely and the fiberoptic bundle which will interface with the assembly will confront a uniform coplanar surface across all of the detectors and VCSELs.

Figure 6:
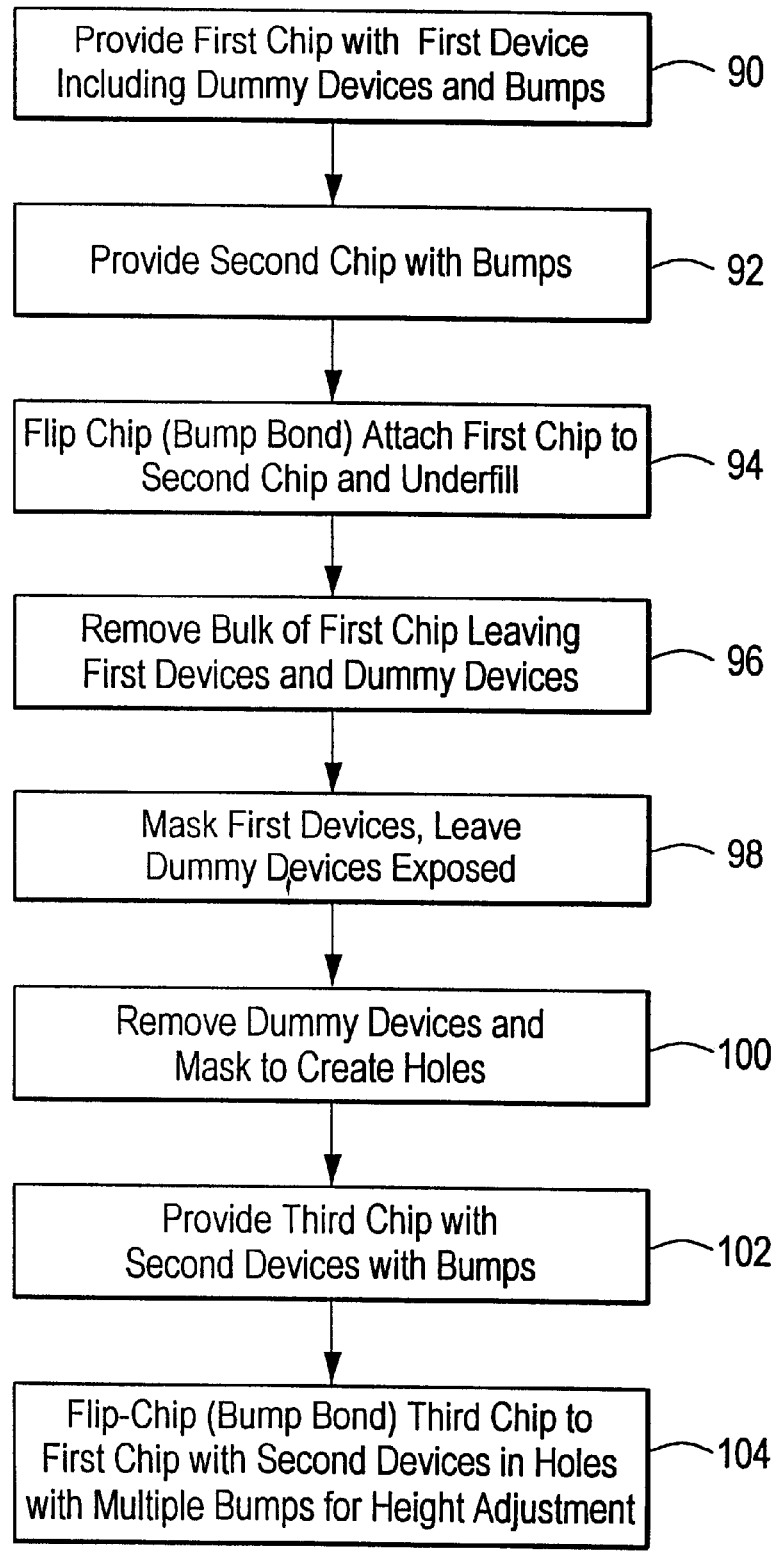
FIG. 6 is a block diagram of the method of this invention.

The method of this invention is shown in the flowchart of FIG. 6 beginning with the provision of a first chip with first devices including dummy devices and bumps, step 90 and then, step 92, providing a second chip with bumps as well as CMOS integrated circuitry such as an application specific integrated circuit (ASIC) or microprocessor. The first chip is then flip chipped and bump bonded to the second chip, step 94, after which the bulk of the first chip is removed except for its first devices, step 96. The first devices are then masked while exposing only the dummy devices that are to be removed. The dummy devices are removed in step 100 and the mask is removed as well to create holes. A third chip is then provided with second devices, and bumps that are patterned to match the holes created by the removal of the dummy devices step 102. This third chip is then bump bonded to the first chip with the second devices in the holes and the multiple bumps left by the creation of the holes and added to by the bumps associated with the detectors operate to adjust the height of the shorter detectors to the height of the taller VCSELs so that the upper ends of all of the devices, VCSELs and detectors, are at the same height and form a coplanar surface for convenient reception of a fiberoptic connector or intervening optics.

In practice, the first and third chips may be gallium arsenide; the second chip may include silicon. The first and third chips may also be made out of indium phosphide, indium gallium arsenide nitride or any other suitable material. The second chip may be made of a silicon germanium or gallium arsenide or any other suitable material. The photoresist used for the mask as in step 98 of FIG. 6, may be an AZ 5218 or equivalent in which case the etching material to remove the dummy devices may be done by either dry etch or wet etch processes. The first and third chips when made of gallium arsenide may be reduced mechanically by lapping or grinding and chemically by the above processes where the dry etch is a RIE (reactive ion etch) process and the wet etch is a standard chlorine containing solution.

Figure 7:
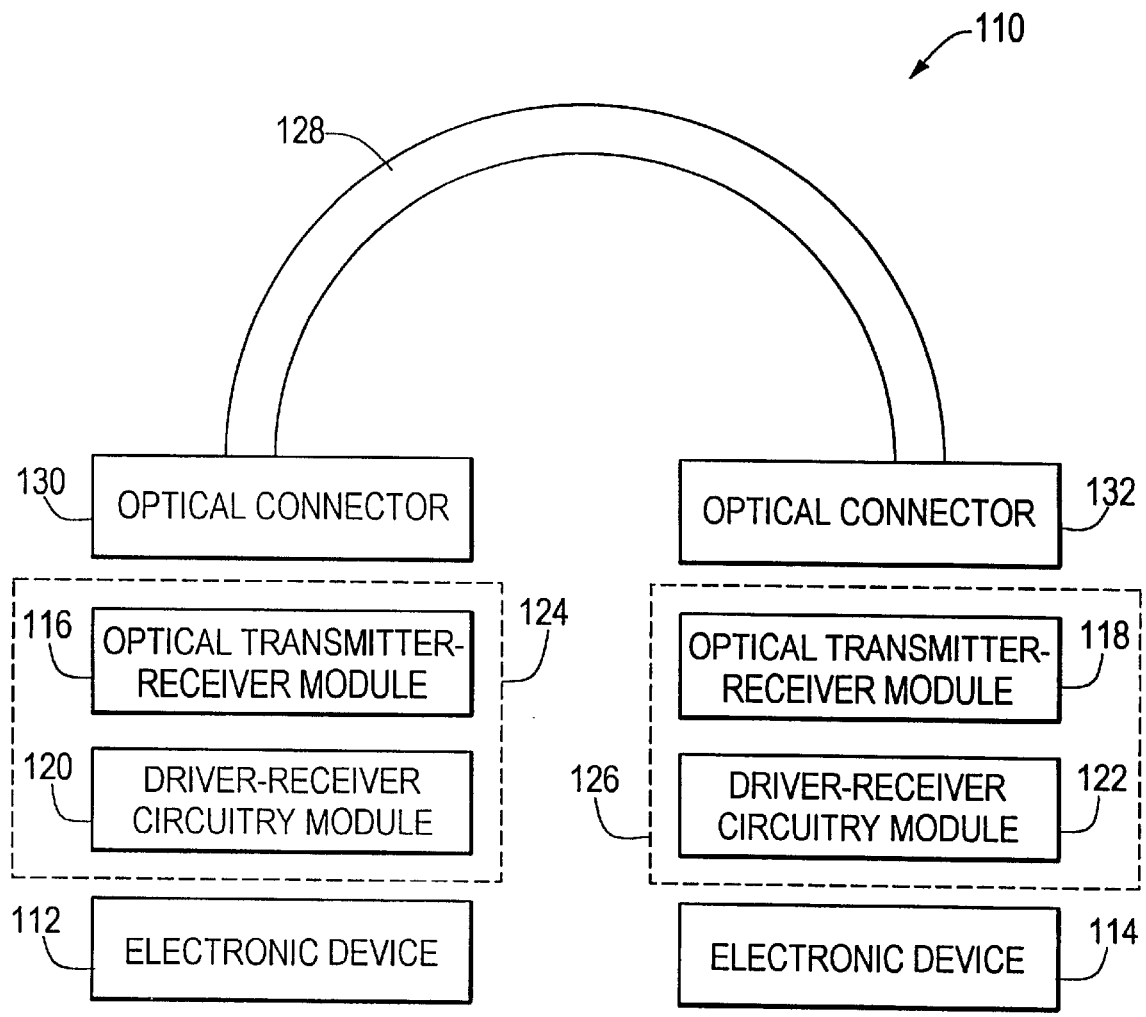
FIG. 7 is a schematic diagrammatic view of a communications system in which the chip with equalized device heights according to this invention can be used.

The assembly of FIG. 5 may be used in a communication system 110, FIG. 7 which provides for optical rather than electrical communication between electronic device 112 and electronic device 114. Electronic devices 112 and 114 may be computers, see U.S. Pat. No. 5,912,913, FIG. 4, two circuit boards in one computer, or two different chips on one circuit board. U.S. Pat. No. 5,912,913 is incorporated herein by this reference.

Optical transmitter-receiver modules 116 and 118 typically include both light emitting device such as vertical cavity surface emitting lasers (VCSELs) and light detecting devices such as p-i-n photodiodes. Modules 116 and 118 may be in the form of chips such that the VCSELs and the photodiodes are hybridized to the same substrate. U.S. Pat. No. 5,978,401 is incorporated herein by this reference.

Driver-receiver circuitry modules 120 and 122 may be in the form of ASIC chips and include driver circuitry for receiving electrical signals from electronic devices 112 and 114 and, in response, driving the VCSELs of modules 120 and 122. The ASICs also include receiver circuitry for receiving signals from the photodiodes of modules 116 and 118 and in response processing these electrical signals and providing an appropriate output to electronic devices 112 and 114.

The combination of an optical transmitter receiver module (116,118) and a driver-receiver circuitry module (120,122) is called an optical transceiver as shown at 124 and 126. One way to hybridize or connect an optical transmitter module (116,118) to a driver-receiver circuitry module (120,122) is by flip chip bonding. See U.S. Pat. No. 6,005,262 incorporated herein by this reference.

Fiber optic cable 128 has one end connected to optical transmitter-receiver module 116 and its other end connected to optical transmitter-receiver module 118 via optical connectors 130 and 132, respectively. See U.S. Pat. No. 5,912, 913.

In this way, electronic device 112 generates an electrical output signal received by module 120 which in turn drives the VCSELs of module 116 generating light pulses representative of the electrical output signal. These light pulses are coupled to fiber optic bundle 128 by optical connector 32. The detectors of module 118 then output an electrical signal representative of the light pulses and this electrical signal is processed by the receiver circuitry of module 122 and communicated to electronic device 114 for further processing.

As shown, system 110 is capable of bi-directional optical communications but in some embodiments unidirectional communications is accomplished if module 116 contains only VCSELs and module 118 contains only detectors in which case module 120 includes only VCSEL driving circuitry and module 122 includes only receiver circuitry.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A method of equalizing device heights on a chip comprising:

providing on a first chip an array of first devices having a predetermined height including dummy devices with bonding bumps;

bump bonding said first chip to a second chip having bonding bumps by engaging the bonding bumps on said first chip with those on said second chip;

removing said dummy devices to create holes containing the multiple bumps previously associated with the dummy devices;

providing on a third chip an array of second devices having a lower height than said first devices with bonding bumps which match those in the holes; and bump bonding said third chip to said second chip with the said second devices in said holes and said bonding bumps on said second devices combining with said multiple bumps in said holes to equalize the height of said first and second devices.

2. The method of claim 1 in which the voids between said first and second chips are filled by an underfill.

3. The method of claim 1 in which said first chip is removed except for said first devices.

4. The method of claim 2 in which said underfill associated with said dummy devices is removed and said underfill associated with the remaining said first devices is preserved.

5. The method of claim 1 in which the voids between said chips associated with said second devices are filled by an underfill.

6. The method of claim 1 in which said devices are photonic devices.

7. The method of claim 1 in which said first and third chips include gallium arsenide.

8. The method of claim 1 in which said second chip includes silicon.

9. The method of claim 1 in which said second chip includes an application specific integrated circuit.

10. The method of claim 1 in which one of said first and second devices include light emitters and the other light detectors.

11. The method of claim 1 in which one of said first and second devices include vertical cavity surface emitting lasers and the other includes p-i-n diodes.

12. The method of claim 1 in which said dummy devices are the same as said first devices.

13. The method of claim 1 in which said first and third chips include indium phosphide.

14. The method of claim 1 in which said first and third chips include indium gallium arsenide nitride.

15. The method of claim 1 in which said second chip includes silicon germanium.

16. The method of claim 1 in which said second chip includes gallium arsenide.

17. The method of claim 2 in which said underfill includes an epoxy.

18. The method of claim 2 in which said underfill includes a photoresist.

19. The method of claim 1 further including removing the first chip except said first devices.

20. The method of claim 1 further including removing the third chip except said second devices.

* * * * *